(12) United States Patent
Batish et al.

(10) Patent No.: US 6,847,122 B1
(45) Date of Patent: Jan. 25, 2005

(54) SYSTEM AND METHOD FOR PREVENTING AND ALLEVIATING SHORT CIRCUITING IN A SEMICONDUCTOR DEVICE

(75) Inventors: Rakesh Batish, Royersford, PA (US); C. Scott Kulicke, Fort Washington, PA (US); Andrew Hmiel, Glenside, PA (US); Walt VonSeggern, New Hope, PA (US)

(73) Assignee: Kulicke & Soffa Investments, Inc., Wilmington, DE (US)

( * ) Notice: Subject to any disclaimer, the term of this patent is extended or adjusted under 35 U.S.C. 154(b) by 0 days.

(21) Appl. No.: 10/686,892

(22) Filed: Oct. 16, 2003

(51) Int. Cl.[7] .......................... H01L 23/12; H01L 23/48; H01L 23/52; H01L 29/40
(52) U.S. Cl. ...................... 257/784; 257/795; 438/127; 438/617
(58) Field of Search ................................. 257/784, 787, 257/783, 789, 795; 438/124, 127, 617, 112

(56) References Cited

U.S. PATENT DOCUMENTS

| | | | |
|---|---|---|---|
| 4,523,371 A | | 6/1985 | Wakashima |
| 4,788,583 A | | 11/1988 | Kawahara et al. |
| 4,974,057 A | | 11/1990 | Tazima |
| 5,097,317 A | | 3/1992 | Fujimoto et al. |
| 5,206,794 A | * | 4/1993 | Long .......................... 257/675 |
| 5,310,702 A | * | 5/1994 | Yoshida et al. ............. 438/123 |
| 5,331,205 A | | 7/1994 | Primeaux |
| 5,434,105 A | | 7/1995 | Liou |
| 5,656,830 A | * | 8/1997 | Zechman ..................... 257/784 |
| 5,818,105 A | | 10/1998 | Kouda |
| 5,824,568 A | * | 10/1998 | Zechman ..................... 438/112 |
| 6,184,587 B1 | * | 2/2001 | Khandros et al. ........... 257/784 |
| 6,215,182 B1 | | 4/2001 | Ozawa et al. |
| 6,297,078 B1 | | 10/2001 | Barrow |
| 6,340,846 B1 | | 1/2002 | LoBianco et al. |
| 6,344,401 B1 | | 2/2002 | Lam |
| 6,368,899 B1 | | 4/2002 | Featherby et al. |
| 2003/0090001 A1 | | 5/2003 | Beatson et al. |

FOREIGN PATENT DOCUMENTS

JP         4-158557       *    6/1992

OTHER PUBLICATIONS

Hmiel, A., et al., "Wire Bond Short Reduction By Encapsulation", SEMI Technology Symposium: International Electronics Manufacturing Technology Symposium, 2003, SEMICON West, San Jose CA.

* cited by examiner

Primary Examiner—S. V. Clark
(74) Attorney, Agent, or Firm—RatnerPrestia

(57) ABSTRACT

A method of packaging a semiconductor device including a plurality of elements is provided. The method includes applying an insulative material to at least a portion of the semiconductor device, where the insulative material includes insulative particles having a diameter smaller than a gap between adjacent conductors providing interconnection between the elements. The method also includes curing the insulative material.

35 Claims, 8 Drawing Sheets

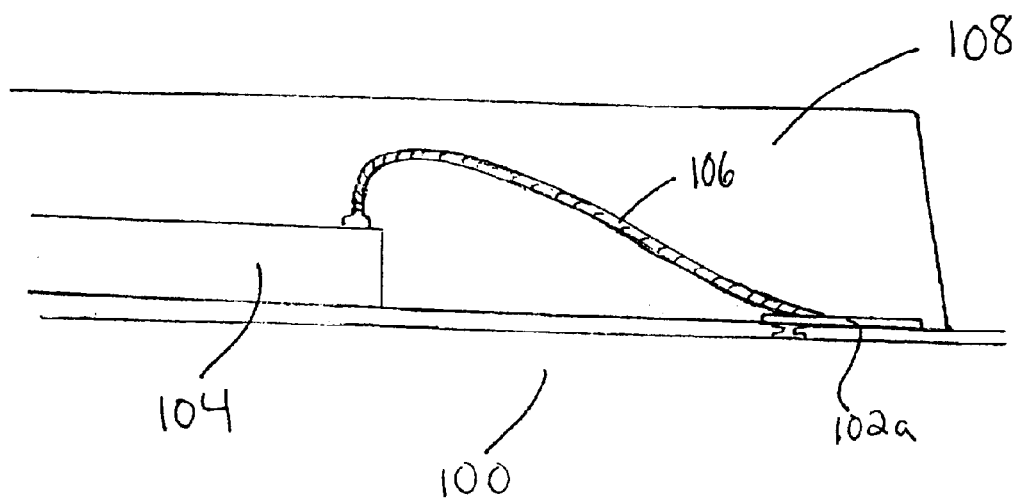
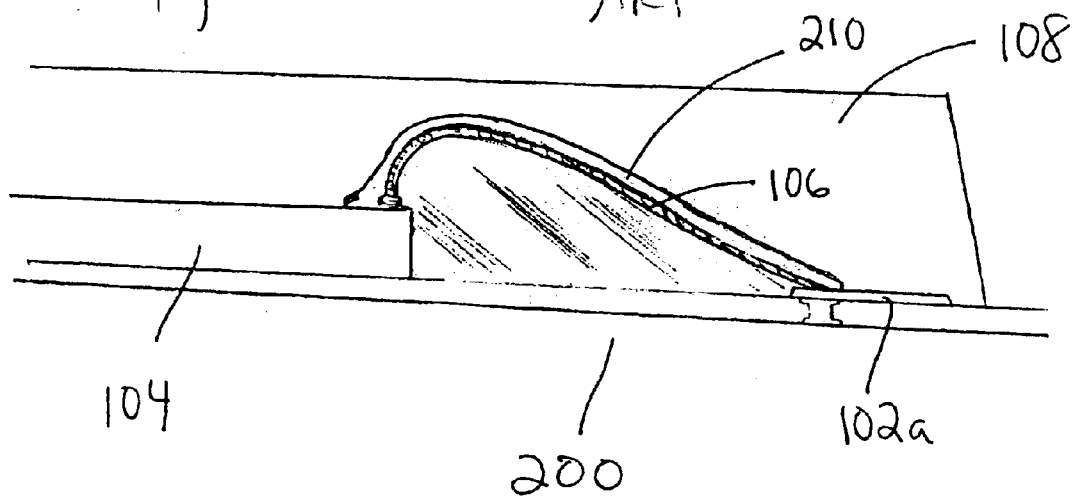

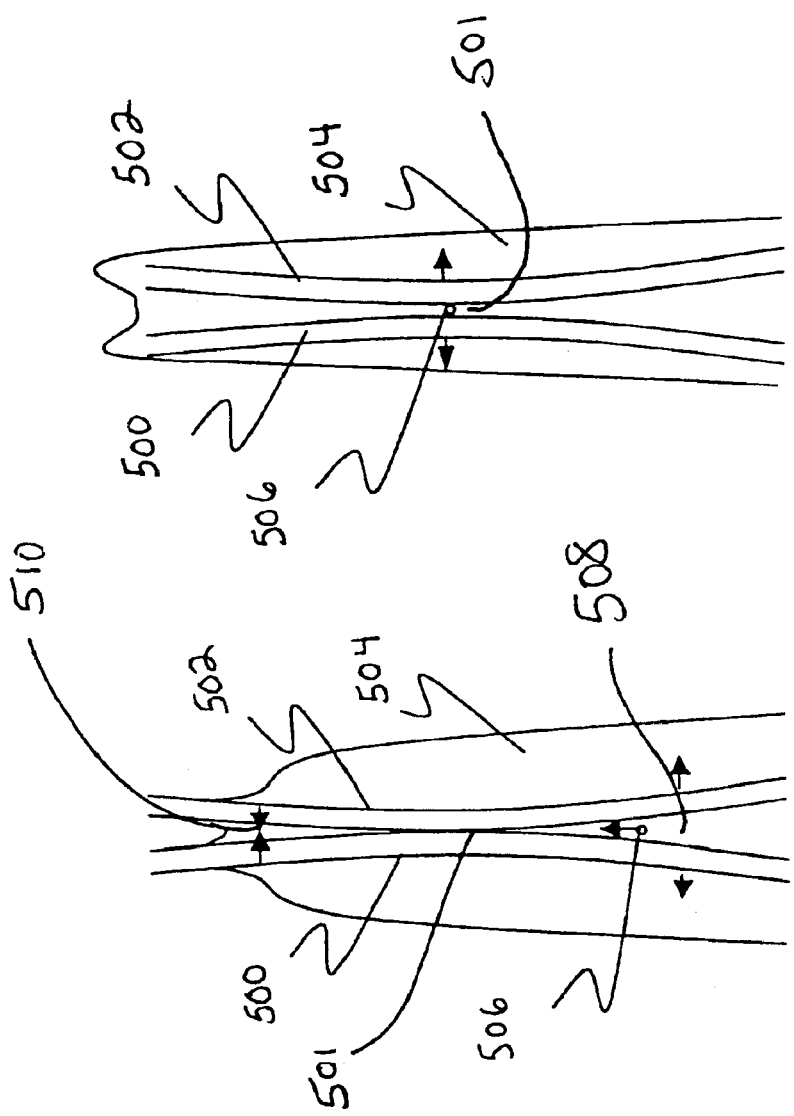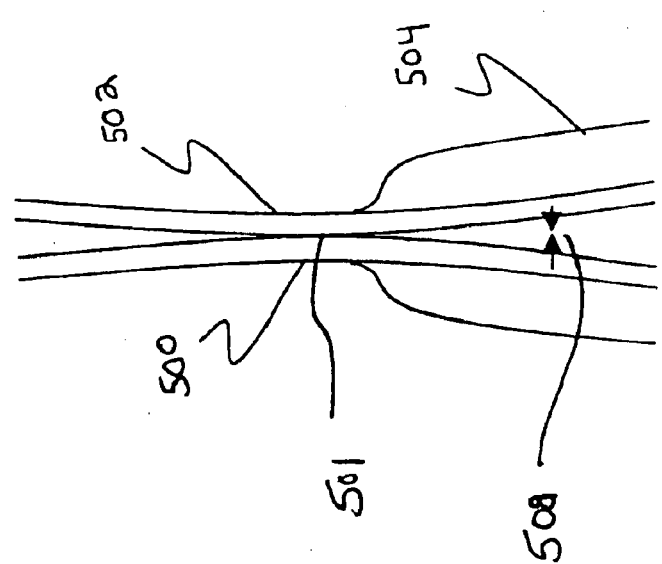

US 6,847,122 B1

SYSTEM AND METHOD FOR PREVENTING AND ALLEVIATING SHORT CIRCUITING IN A SEMICONDUCTOR DEVICE

FIELD OF THE INVENTION

This invention relates to packaging of semiconductor devices, and more particularly to a method of preventing and alleviating short circuiting in packaged semiconductor devices.

BACKGROUND OF THE INVENTION

In the fabrication of semiconductor devices, conductors (e.g., bonding wires) are often utilized to provide interconnection between elements of the semiconductor device. For example, FIG. 1 illustrates a portion of conventional semiconductor device 100. Semiconductor device 100 includes leadframe 102 and leadframe contact(s) 102a. Semiconductor element (e.g., die) 104 is mounted on leadframe 102. Bonding wire 106 provides interconnection between semiconductor element 104 and leadframe contact 102a. Overmold 108 (i.e., a mold compound) is provided over bonding wire 106, semiconductor element 104, and leadframe contact 102a. In the configuration illustrated in FIG. 1, a number of bonding wires 106 may be included in semiconductor device 100 to provide interconnection between various connection points on semiconductor element 104 and corresponding leadframe contacts 102a.

During the process of fabricating semiconductor device 100, short circuits between adjacent bonding wires 106, or open circuits in connection with one or more bonding wires 106 may occur. For example, during fabrication, movement (e.g., sway, sweep, etc.) of bonding wires 106 may result in a short circuit between adjacent bonding wires 106.

FIG. 2 illustrates a conventional semiconductor device 200 including an encapsulant 210 over bonding wire 106. Encapsulant 210 also covers the connection points between bonding wire 106 and each of semiconductor element 104 and leadframe contact 102a. In other respects, the elements illustrated in FIG. 2 are very similar to those illustrated and described above with respect to FIG. 1.

FIG. 3 is a perspective view of a conventional semiconductor device 100, similar to the device illustrated in FIG. 1. Semiconductor element 104 is illustrated mounted on leadframe 102. A plurality of bonding wires 106 provide interconnection between semiconductor element 104 and corresponding leadframe contacts 102a. Overmold 108 (partially cut away in FIG. 3) is provided over semiconductor element 104 and bonding wires 106.

Various problems have been found in the conventional semiconductor device configurations illustrated in FIGS. 1–3. As provided above, during fabrication and movement of the semiconductor devices, bonding wires 106 may be become loose (i.e., open circuit) at one of the connection points (i.e., at semiconductor element 104 or leadframe contact 102a). Further, adjacent bonding wires 106 may move (e.g., sway) towards each other, particularly when overmold 108 is applied, thereby creating short circuits in the semiconductor device. These issues are particularly problematic in view of the desire to decrease the size of semiconductor devices (and the corresponding desire to increase conductor density in semiconductor devices). These fabrication shortcomings result in defective components within semiconductor lots, resulting in higher manufacturing costs and poor reliability. These problems are particularly evident in ultrafine pitch wirebonded devices. As such, it would be desirable to provide improved methods of fabricating semiconductor devices, particularly with respect to ultrafine pitch wirebonded devices.

SUMMARY OF THE INVENTION

To overcome the deficiencies of the prior art. In an exemplary embodiment of the present invention, a method of packaging a semiconductor device including a plurality of elements is provided. The method includes applying an insulative material to at least a portion of the semiconductor device, where the insulative material includes insulative particles having a diameter smaller than a gap between adjacent conductors providing interconnection between the elements. The method also includes curing the insulative material.

According to another exemplary embodiment of the present invention, a semiconductor device is provided. The semiconductor device includes a plurality of semiconductor elements, and a plurality of conductors providing interconnection between the plurality of semiconductor elements. The semiconductor device also includes an insulative material including insulative particles having a diameter smaller than a gap between adjacent ones of the conductors. The insulative material covers at least a portion of the plurality of conductors.

BRIEF DESCRIPTION OF THE DRAWINGS

Exemplary embodiments of the invention will be described with reference to the drawings, of which:

FIG. 1 is a cut away side view of an interconnection between elements in a prior art semiconductor device;

FIG. 2 is a cut away side view of an encapsulated interconnection between elements in a prior art semiconductor device;

FIG. 5(a) through 5(c) are illustrations of steps for separating shorted conductors in a semiconductor device in accordance with an exemplary embodiment of the present invention;

DETAILED DESCRIPTION OF THE INVENTION

Figure 3:
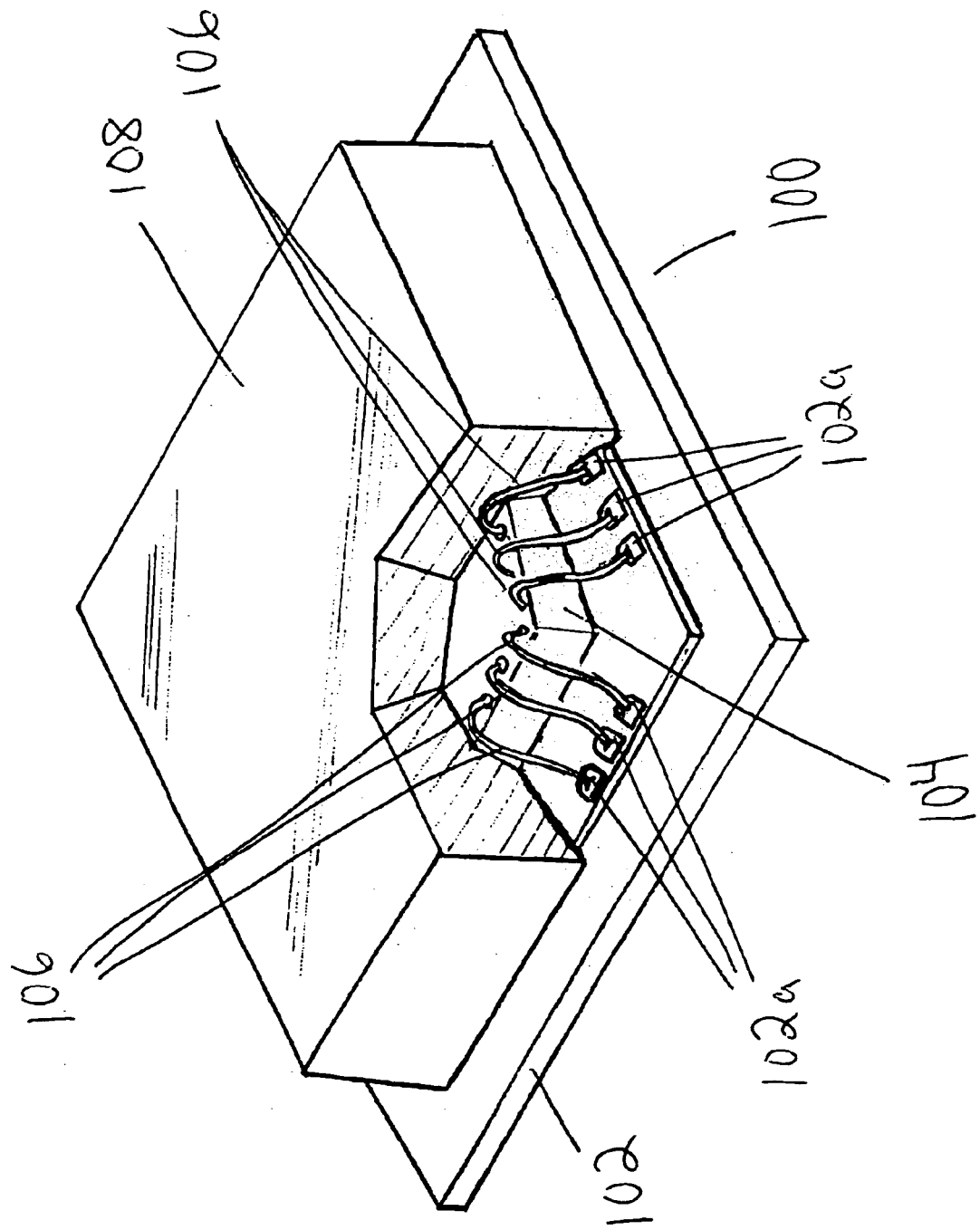
FIG. 3 is a perspective view of a plurality of interconnections between elements in a prior art semiconductor device.

Preferred features of selected embodiments of this invention will now be described with reference to the figures. It will be appreciated that the spirit and scope of the invention is not limited to the embodiments selected for illustration. Also, it should be noted that the drawings are not rendered to any particular scale or proportion. It is contemplated that any of the configurations and materials described hereafter can be modified within the scope of this invention.

As used herein, the term semiconductor device relates to a broad category of devices including packaged semiconductor devices such as integrated circuits, memory devices, BGA (i.e., ball grid array), DSPs (i.e., digital signal processors), QFP (i.e., quad-flat package), PBGA (i.e., plastic ball grid array), BOC (board on chip), COB (i.e., chip on board), CABGA (chip array ball grid array), and discrete devices (i.e., non-packaged devices, may be more than one device on one board). Further, the term semiconductor element refers to any portion of a semiconductor device, including substrates, dies, chips, leadframes, leadframe contacts, etc.

Generally, in one exemplary embodiment, the present invention relates to protecting bonding wires from sweep during certain fabrication steps (e.g., overmolding ultrafine pitch semiconductor devices). In another exemplary embodiment, the present invention relates to alleviating short-circuited bonding wires (e.g., in ultrafine and fine pitch devices).

More specifically, the present invention relates to the application and cure of an insulative material (e.g., an encapsulant, a polymer material, an epoxy resin, etc.) including a defined distribution of insulative particles (e.g., an inorganic powder, silica particles, etc.), such that a portion of the insulative particles flow through the spacing (e.g., the fine or ultrafine spacing) between bonding wires in a wirebonded semiconductor device. According to various exemplary embodiments, the present invention relates to facilitating movement of bonding wires that may be touching (i.e., short-circuited) such that after the application of the insulative material the short-circuited bonding wires are no longer touching, and are in fact insulated from one another by the insulative material including the insulative particles. It has been found that such a process, including the methodology of dispensing the insulative material to enhance short-circuit removal, is particularly useful in protecting against short-circuiting during certain fabrication steps (e.g., resin transfer molding process, glob top encapsulation, etc.).

In addition to alleviating existing bonding wire short circuits during processing, the application of the insulative material substantially reduces bonding wire short-circuits that occur during the assembly of wirebonded semiconductor devices (e.g., ultra fine pitch wirebonded semiconductor devices). The method is particularly useful in enhancing semiconductor device production yield during globtop encapsulation of semiconductor devices, and during resin transfer molding of semiconductor devices (i.e., when the insulative material/encapsulant is applied after bonding of the conductors). The use of the insulative material (and the associated process) allows for the molding of ultra fine pitch wires with high productivity yields, substantially without a limitation related to wire loop length, wire sweep, or wire droop.

Figure 4A:
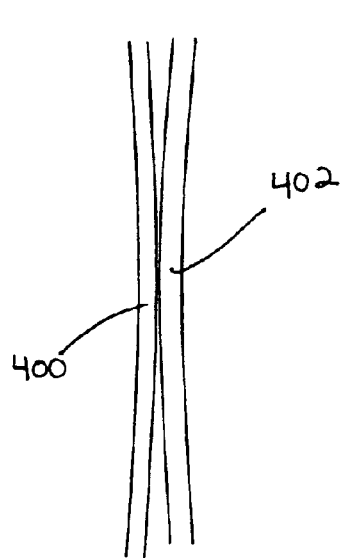
FIGS. 4(a) through 4(c) are illustrations of short circuited conductors in a semiconductor device.
Figure 4B:
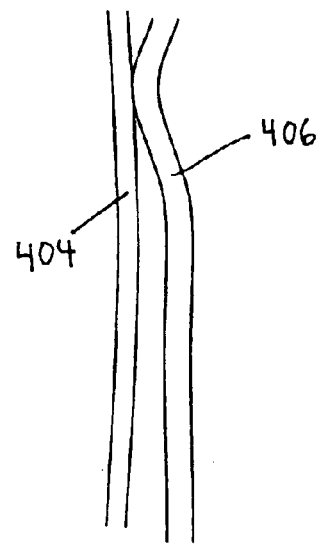
Figure 4C:
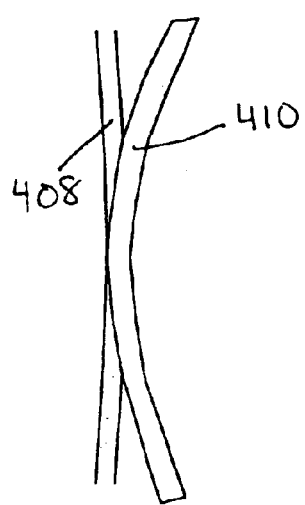

FIGS. 4(a) through 4(c) illustrate examples of short-circuited bonding wires. For example, the bonding wires provide interconnection between semiconductor elements included in a semiconductor device (e.g., as shown in FIGS. 1–3). FIG. 4(a) illustrates adjacent bonding wires 400 and 402. At least one of wires 400 and 402 are slightly bent towards one another, and as such, a short circuit occurs. The type of short circuit illustrated in FIG. 4(a) may occur when either (or both) of bonding wires 400 and 402 is bent towards the other. This type of short circuit is known as a tangential short circuit.

FIG. 4(b) illustrates adjacent bonding wires 404 and 406. Bonding wire 406 is kinked, and as such, a short circuit occurs between the kinked portion of bonding wire 406 and adjacent bonding wire 404. This type of short circuit is known as a kinked short circuit.

FIG. 4(c) illustrates adjacent bonding wires 408 and 410. One (or both) of bonding wires 408 and 410 is curved towards the other, and as such, one of bonding wires 408 and 410 is arranged on top of the other of bonding wires 408 and 410. This type of short circuit is known as a highly crossed short circuit.

FIGS. 5(a) through 5(c) illustrate a method of alleviating a short circuit between adjacent bonding wires of a semiconductor device. FIG. 5(a) illustrates adjacent bonding wires 500 and 502. Bonding wires 500 and 502 are short-circuited with respect to one another (at location 501) as illustrated and described above with respect to FIG. 4(a). Encapsulant 504 has been applied to short circuited bonding wires 500 and 502 in FIG. 5(a). A capillary action (as will be further described herein) of encapsulant 504 is directed towards pushing bonding wires 500 and 502 together, as indicated at location 508.

FIG. 5(b) illustrates that bonding wires 500 and 502 continue to be short-circuited with respect to one another; however, encapsulant 504 has covered the majority of the length of each of bonding wires 500 and 502 illustrated in FIG. 5(b). Further, encapsulant 504 is drawing insulative particles (e.g., silica particles) that are included in encapsulant 504 between bonding wires 500 and 502. For example, insulative particle 506 has been drawn between bonding wires 500 and 502 in FIG. 5(b), particularly towards the short circuit between bonding wires 500 and 502 at location 501. The capillary force of encapsulant 504 is now acting to separate bonding wires 500 and 502, as shown at location 508 in FIG. 5(b); however, as the capillary force of encapsulant 504 proceeds from the bottom to the top of FIG. 5(b), bonding wires 500 and 502 are being drawn towards one another at location 510.

FIG. 5(c) illustrates encapsulant 504 fully covering the illustrated portions of bonding wires 500 and 502. Insulative particle 506 has been drawn into position 501, and has alleviated the short circuit between bonding wires 500 and 502. For example, insulative particle 506 may have been drawn into position 501 through the relaxation of bonding wires 500 and 502, thereby seeking their respective equilibrium position.

According to certain experimental data connected with the present invention, it has been determined by the inventors that through the capillary force, and surface tension of the insulative material (including the insulative particles), short circuits between adjacent bonding wires may be corrected in up to 80% of the cases. Further, it has been determined that the methods disclosed herein are extremely successful at removing tangentially short circuited bonding wires (e.g., FIG. 4(a)), and somewhat less successful (but still very successful) at removing kinked short circuited bonding wires (e.g., FIG. 4(b)) and highly crossed short circuited bonding wires (e.g., FIG. 4(c)). Regardless of the type of short circuit, approximately 80% (and sometimes and even greater percentage) of short circuits can be removed utilizing the techniques disclosed herein.

Further still, if the bonding wires are cleaned (e.g., plasma cleaned) prior to application of the insulative material, an even greater percentage of short circuited bonding wires may be corrected.

Figure 6:
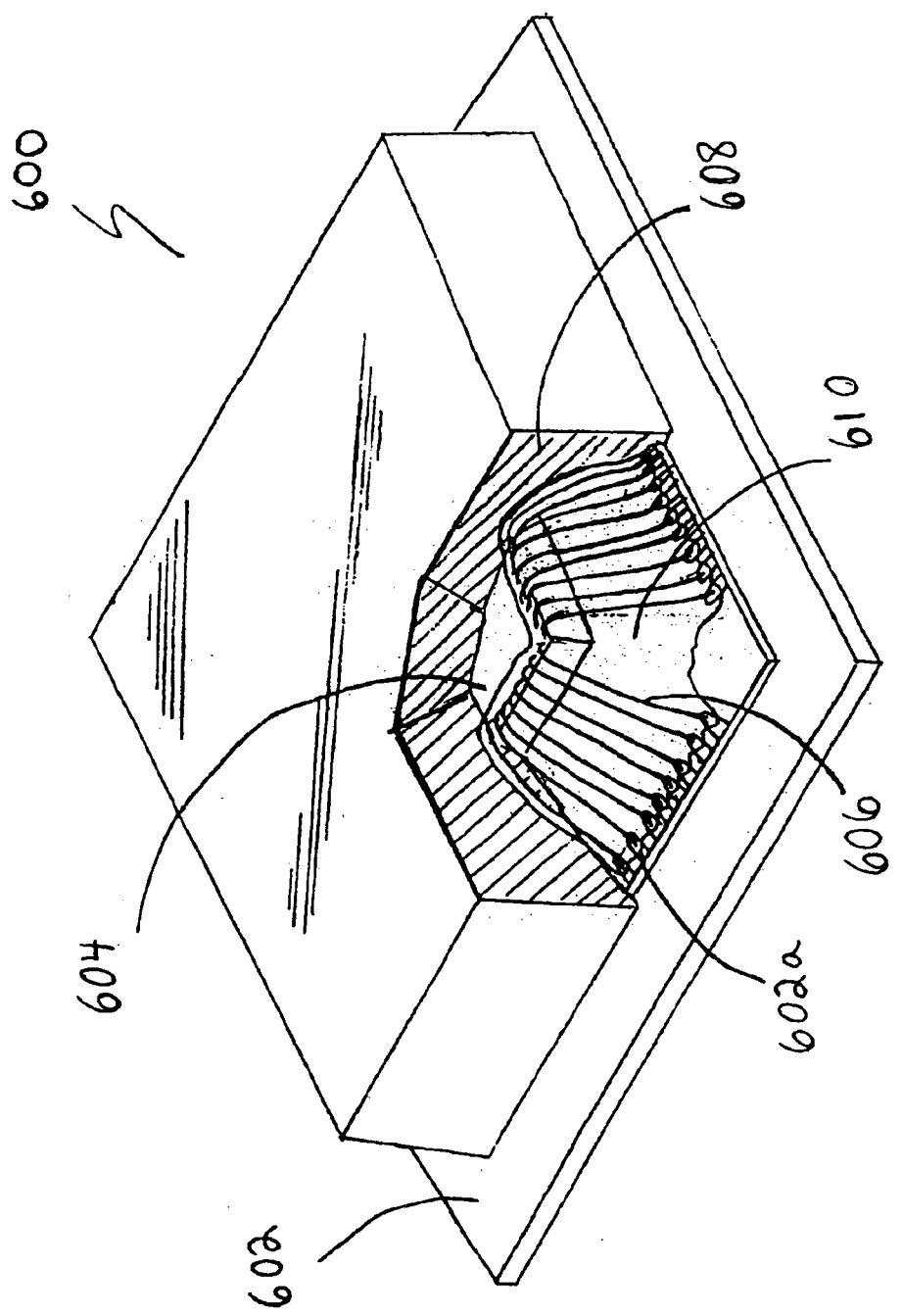
FIG. 6 is a perspective view of an insulated interconnection between elements in a semiconductor device in accordance with an exemplary embodiment of the present invention.

FIG. 6 illustrates a cut away side view of semiconductor device 600 in accordance with an exemplary embodiment of the present invention. Semiconductor device 600 includes semiconductor element 604 (e.g., a die) mounted on leadframe 602. For example, semiconductor element 604 may be mounted to leadframe 602 using an adhesive. Bonding wires 606 provide interconnection between semiconductor element 604 and leadframe contacts 602a. Before overmold 608 is applied to the device, insulative material 610 is applied to the device to cover at least a portion of bonding wires 606. For example, insulative material 610 may be applied to the top surface of semiconductor element 604 (e.g., die 604), and therefrom disperses and distributes onto bonding wires 606. Alternatively, insulative material 606 may be directly applied to bonding wires 606. Insulative material 606 includes insulative particles (not shown in FIG. 6) (e.g., silica particles) preferably having a diameter that is less than the separation between adjacent bonding wires 606. In such an embodiment of the present invention, after insulative material 606 is applied to the device, the insulative particles distribute between adjacent bonding wires 606, thereby providing insulated separation for reducing, preventing, or alleviating short-circuiting.

Insulative material 610 may be, for example, a polymer material such as an epoxy resin encapsulant material. Additionally, according to an exemplary embodiment of the present invention, the insulative particles distributed in insulative material 606 have a mean particle size of approximately 4.1 μm, a median particle size of 4.5 μm, and a maximum particle size of 20 μm. These insulative particles may be, for example, spherical silica particles.

The insulative material is designed such that it has a viscosity that allows for the generation of an interwire capillary force and a surface tension whereby insulative particles move between the bonding wires. The design viscosity relates, at least partially, to the design dispersion temperature of the insulative material, and the type of insulative material dispenser utilized. For example, at room temperature, the viscosity may be between 10,000 and 30,000 centipoise when dispersed. The viscosity may be reduced by heating the insulative material and/or the semiconductor device.

Figure 7:
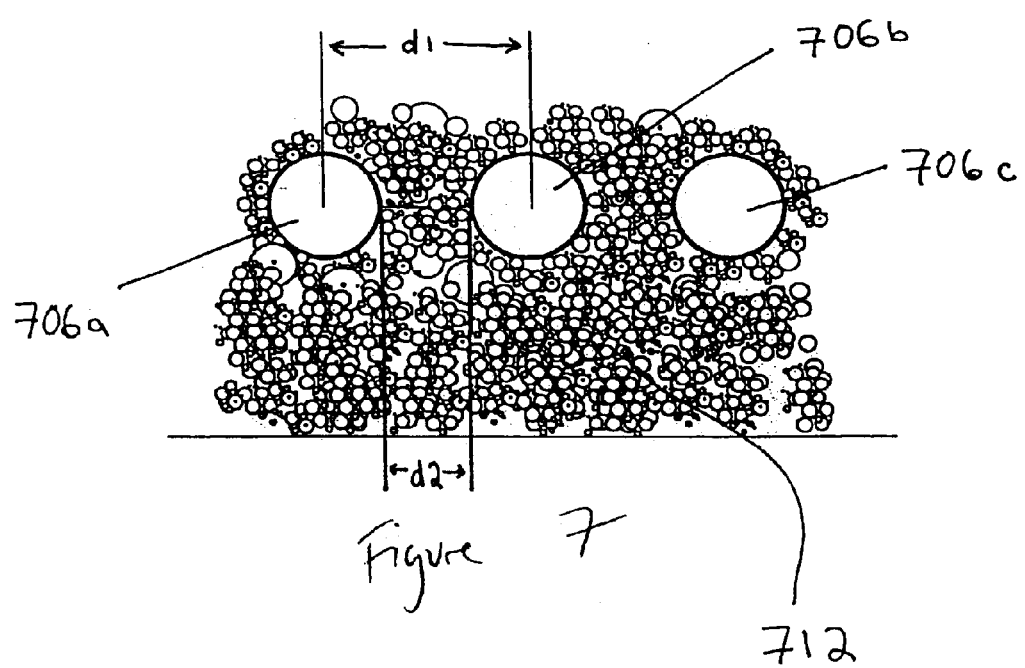
FIG. 7 is a cut away view of conductors separated by an insulative material in accordance with an exemplary embodiment of the present invention.

FIG. 7 is a cut away view of bonding wires 706a, 706b, and 706c. For example, bonding wires 706a, 706b, and 706c provide interconnection between a semiconductor element (not shown in FIG. 7) and leadframe contacts (not shown in FIG. 7) in a semiconductor device. Insulative material 712 is provided across at least a portion of bonding wires 706a, 706b, and 706c. In the exemplary embodiment of the present invention illustrated in FIG. 7, insulative material 712 includes insulative particles/beads. The insulative beads may be of a variety of different sizes, and because the insulative beads are smaller than the distance between adjacent bonding wires (e.g., between bonding wire 706a and 706b), the insulative beads disperse into a position between adjacent bonding wires, thereby providing enhanced stability and insulation between adjacent bonding wires.

FIG. 7 illustrates a distance "d1" representing a center-to-center distance (i.e., pitch) between bonding wires 706a and 706b. Further, FIG. 7 illustrates a distance "d2" representing a spacing between bonding wires 706a and 706b. According to an exemplary embodiment of the present invention, the insulative material may be applied to ultrafine pitch bonding wired semiconductor devices. For example, distance d1 in such a device may be approximately 35 μm or less, and distance d2 in such a device may be approximately 15 μm or less. By providing insulative material (e.g., with insulative beads dispersed therein) across at least a portion of the bonding wires, the improved bonding wire stability and insulation of the present invention may be applied to ultrafine pitch wirebonded semiconductor devices with small values for distances d1 and d2.

It has been found that by fabricating semiconductor devices according to the methods described herein, conductor density (i.e., bonding wire density) within a semiconductor device may be increased, desirably resulting in a semiconductor device of decreased size or increased space efficiency.

The insulative particles/beads included in the insulative material utilized according to various exemplary embodiments of the present invention may be any of a number of types of insulative particles. For example, the particles may be constructed of a silica filler. Further, the insulative particles may be of varying types having varying sizes and shapes.

Figure 8:
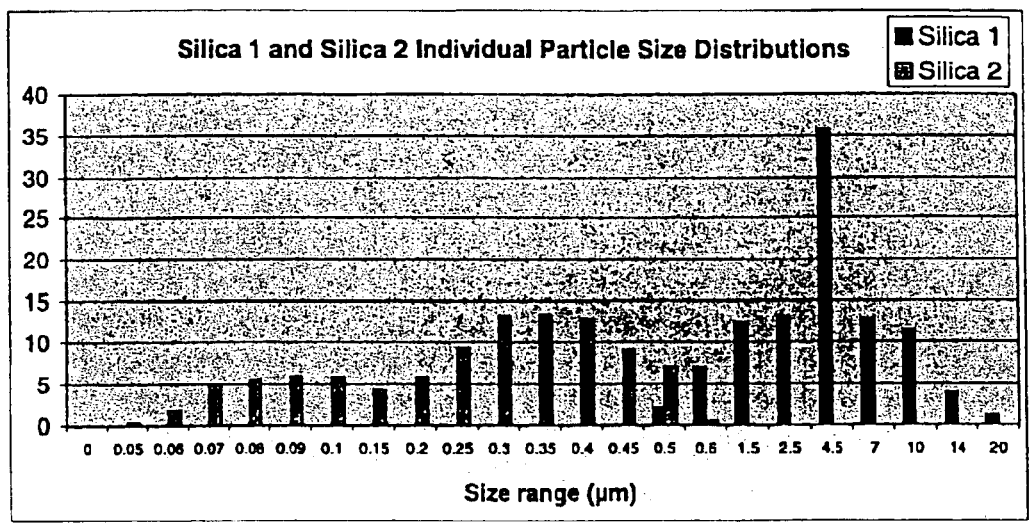
FIG. 8 is a chart illustrating a silica particle size distribution in an insulative material in accordance with an exemplary embodiment of the present invention.

FIG. 8 is a bar chart illustrating an exemplary particle size (i.e., particle size diameter) distribution of two distinct silica fillers (e.g., $SiO_2$) used in an insulative material according to an exemplary embodiment of the present invention. In the exemplary distribution illustrated in FIG. 8, the silica 2 particle size beads range from approximately 0.05 microns to approximately 0.5 microns. Further, the distribution of silica 1 particle size beads ranges from approximately 0.5 microns to approximately 20 microns. The y-axis of the bar chart of FIG. 8 illustrates the percentage of each size of each of the silica 1 and silica 2 particles.

The silica fillers charted in FIG. 8 have proven to be particularly useful when dispersed within insulative materials (e.g., epoxy resin) according to certain exemplary embodiments of the present invention. The individual distribution of the silica diameter sizes for the type of spherical silica designated silica 1 is: 0% are greater than 24 microns, 1.1% are less than 24 microns and greater than 16 microns, 4.0% are less than 16 microns and greater than 12 microns, 11.5% are less than 12 microns and greater than 8 microns, 12.8% are less than 8 microns and greater than 6 microns, 35.8% are less than 6 microns and greater than 3 microns, 13.3% are less than 3 microns and greater than 2 microns, 12.5% are less than 2 microns and greater than 1 microns, 7.0% are less than 1 microns and greater than 0.5 microns, and 2.0% are less than 0.5 microns and greater than 0 microns. The individual distribution of the silica diameter sizes for the type of spherical silica designated silica 2 is: 0% are greater than 0.6 microns, 0.5% are less than 0.6 microns and greater than 0.5 microns, 7.03% are less than 0.5 microns and greater than 0.45 microns, 9.13% are less than 0.45 microns and greater than 0.4 microns, 12.83% are less than 0.4 microns and greater than 0.35 microns, 13.43% are less than 0.35 microns and greater than 0.3 microns, 13.33% are less than 0.35 microns and greater than 0.3 microns, 9.33% are less than 0.3 microns and greater than 0.25 microns, 5.83% are less than 0.25 microns and greater than 0.2 microns, 4.33% are less than 0.2 microns and greater than 0.15 microns, 5.83% are less than 0.15 microns and greater than 0.1 microns, 5.93% are less than 0.1 microns and greater than 0.09 microns, 5.53% are less than 0.09 microns and greater than 0.08 microns, 4.93% are less than 0.08 microns and greater than 0.07 microns, 1.73% are less than 0.07 microns and greater than 0.06 microns, and 0.31% are less than 0.06 micron.

As provided above, insulative particles (e.g., silica particles) of varying types and sizes may be mixed in an insulative material according to certain exemplary embodiments of the present invention. For example, the silica 1 distribution of particles may be mixed with the silica 2 distribution of particles. In one embodiment, 10 parts of the silica 1 distribution of particles is mixed with 3 parts of the type silica 2 distribution of particles. A bar chart illustrating the $SiO_2$ particle size distribution of such a mixture if provided in FIG. 9.

Figure 9:
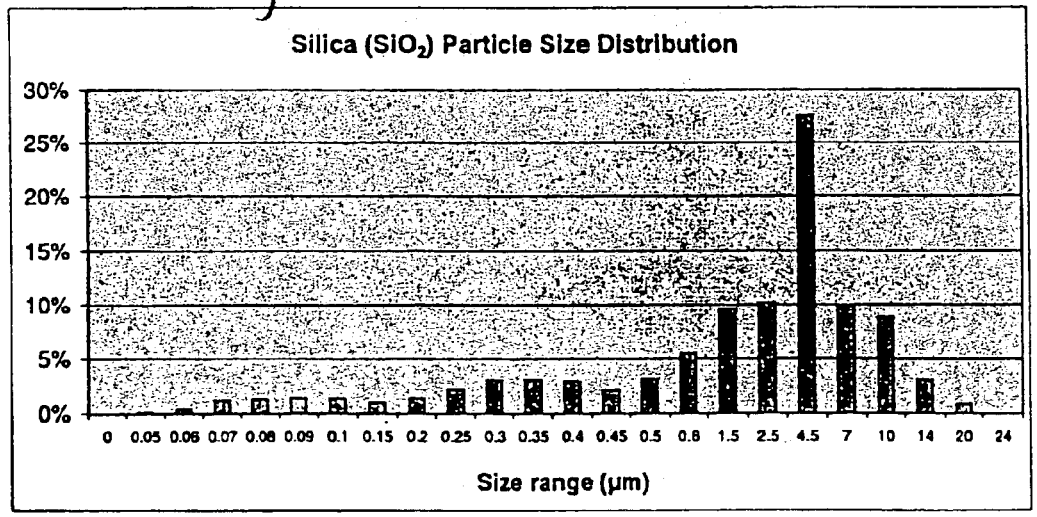
FIG. 9 is another chart illustrating a silica particle size distribution in an insulative material in accordance with an exemplary embodiment of the present invention.

The individual distribution of the silica diameter sizes for the mixture of spherical silica illustrated in FIG. 9 is: 0% are greater than 24 microns, 0.85% are less than 24 microns and greater than 16 microns, 3.08% are less than. 16 microns and greater than 12 microns, 8.85% are less than 12 microns and greater than 8 microns, 9.85% are less than 8 microns and greater than 6 microns, 27.54% are less than 6 microns and greater than 3 microns, 10.23% are less than 3 microns and greater than 2 microns, 9.62% are less than 2 microns and greater than 1 microns, 5.5% are less than 1 microns and greater than 0.6 microns, 3.16% are less than 0.6 microns and greater than 0.5 microns, 2.11 are less than 0.5 microns and greater than 0.45 microns, 2.96 are less than 0.45 microns and greater than 0.4 microns, 3.1 are less than 0.4 microns and greater than 0.35 microns, 3.08 are less than 0.35 microns and greater than 0.3 microns, 2.15 are less than 0.3 microns and greater than 0.25 microns, 1.35 are less than 0.25 microns and greater than 0.2 microns, 1.0 are less than 0.2 microns and greater than 0.15 microns, 1.35 are less than 0.15 microns and greater than 0.1 microns, 1.37 are less than 0.1 microns and greater than 0.09 microns, 1.28 are less than 0.09 microns and greater than 0.08 microns, 1.14 are less than 0.08 microns and greater than 0.07 microns, 0.4 are less than 0.07 microns and greater than 0.06 microns, 0.07 are less than 0.6 microns and greater than 0.5 microns, and 0% are less than 0.05 microns.

It has been found that the application of an insulative material according to the present invention is particularly useful in protecting bonding wires in semiconductor packages from wire sweep during fabrication (e.g., during the overmolding process after application of the insulative material), where the length to diameter ratio of the longest bonding wires is greater than 250. In certain embodiments, the process includes dispensing the insulative material (e.g., while the semiconductor device is still on the wirebonding machine), and thereafter a period of time is provided for the material to flow. The flow time can be, for example, from two to 50 seconds (and more specifically between 7 and 25 seconds) depending on several conditions such as size of the semiconductor device, temperature of the semiconductor device, temperature of the insulative material during dispensing, and the density of the conductors providing interconnection between the elements. Thereafter, the insulative material is cured using some combination of heat, UV radiation, visible radiation, and IR radiation.

As provided herein, the application of the insulative material including insulative particles of specific sizes and quantities is particularly useful in improving the ability of the insulative material to flow between and separate, short-circuited bonding wire pairs. For example, small diameter inorganic particles may be used to fill in between the bonding wires. Furthermore, the type of insulative material (e.g., polymer resin) utilized may enhance the surface energy properties of the insulative material/encapsulant to maximize the short-circuit prevention and reduction properties.

For example, the scale of the insulative particles (i.e., filler particles) is explicitly smaller than the gaps between adjacent bonding wires, and is added in specific sizes and quantities to improve the flow of the insulative material. The insulative material/encapsulant may be rapidly cured through exposure to a UV source of radiation, or to a combination of UV radiation, visible radiation, and infrared radiation. The methods disclosed herein are particularly useful when the insulative material is applied immediately or shortly after wirebonding, and when the bonding wire lengths are at least 250 times larger than the bonding wire diameter.

Through the various exemplary embodiments disclosed herein, the present invention may provide packaged semiconductor devices with longer, thinner, bonding wires, and with a higher density of I/O connections, at smaller pad pitch. The yield of the semiconductor devices is also increased, particularly with respect to post-bond substrate handling, overmolding, and globtop encapsulation. The yield of the semiconductor devices is increased by preventing shorts of fine pitch, small diameter wirebonded semiconductor devices through the application of the insulative material including a combination of small and intermediate size insulative particles (e.g., spherical silica particles) to the device for dispersion and distribution between adjacent bonding wires, and subsequently curing/gelling the insulative material (e.g., on the wirebonder) using heat, exposure to radiation (ultraviolet, visible, and/or infrared), and/or through a thermal batch process. According to an exemplary embodiment of the present invention, the insulative material, including the combination of small and intermediate size spherical silica, is applied using an automatic dispensing machine as soon as is practical after wirebonding.

The curing and/or gelling of the insulative material may vary depending upon the embodiment of the present invention utilized. For example, the insulative material may be cured/gelled directly on the wirebonder using heat and exposure to ultraviolet radiation. According to another exemplary embodiment of the present invention, the insulative material may be cured/gelled on the wirebonder by heat and exposure to a combination of ultraviolet, visible, and infrared radiation. According to yet another exemplary embodiment of the present invention, the insulative material may be cured/gelled using a thermal batch process.

The insulative material may be an epoxy encapsulant material including substantially spherical silica particles that are, at least partially, smaller than the space between adjacent bonding wires in an ultrafine pitch wirebonded semiconductor device. In such an embodiment, the encapsulant material may be designed such that a specific intensity, duration, and wavelength distribution of ultraviolet radiation, visible radiation, and/or infrared radiation, rapidly gels or at least partially cures the encapsulant material. Further, the characteristics of the insulative material, and the application process parameters thereof, may be designed such that as the insulative material is dispensed onto the wirebonded semiconductor device, it covers the entire bonding wire(s), or a portion of the bonding wire(s).

Further still, the insulative material may be applied in any of a number of directions. For example, the insulative material may be applied from a leadframe contact towards an inner semiconductor element of the semiconductor device (e.g., a die). Alternatively, the insulative material may be applied from an inner semiconductor element of the semiconductor device (e.g., a die) towards a leadframe contact of the semiconductor device. Yet another alternative would be to apply the insulative material from directly above (or below) the bonding wires themselves.

Before application of the insulative material, the semiconductor device is preferably heated, for example, to a temperature between 50° C. and 125° C., and more specifically to a temperature between 80° C. and 100° C. Further, the insulative material dispenser is also preferably heated, for example, to a temperature between 35° C. and 85° C., and more specifically to a temperature between 50° C. and 70° C. By heating the insulative material in the insulative material dispenser, it is easier to dispense the insulative material.

As provided above, the insulative material preferably includes a filler material including insulative particles. For example, the filler material may be assembled from combinations of silica with size distributions determined based on various criteria. For example, the size distribution may be based on the following objectives: (1) to carry small silica particles into the narrow space between adjacent bonding wire loops, thereby driving the bonding wires apart; (2) to force the silica (e.g., by a capillary force) to provide a relatively high level of electrical isolation between adjacent bonding wires; (3) to fix the silica and the remainder of the insulative material (e.g., polymer) in place to stabilize the bonding wires, thereby sustaining the electrically insulative capabilities of the insulative material; (4) to minimally interfere with the fragile wire loops during the application of the insulative material; (5) to increase the packing density of the silica particles to achieve a low CTE; and (6) to provide smooth flowing capabilities of the insulative material.

The process of applying the insulative material may include dispensing of the insulative material, and curing the insulative material while the semiconductor device is on the wirebonding machine, such that the delicate loops of the thin bonding wire are stabilized and preserved immediately after (or shortly thereafter) the wirebonding process is complete.

Further still, the dispensing of the insulative material may occur while successive semiconductor devices are being wirebonded, such that a relatively quick and efficient fabrication process may be accomplished. For example, while a first semiconductor device is receiving the insulative material from the insulating material dispenser (and subsequently being cured/gelled), a second semiconductor device is being wirebonded. Such operations (i.e., application of insulative material, and curing/gelling of the insulative material) may be applied to both the first and second semiconductor devices on the same wirebonding apparatus.

As provided above, the insulative material/encapsulant is applied immediately after wirebonding (or almost immediately after, or as soon as practical after wirebonding using an automatic dispensing machine), and the curing/gelling is performed by application of heat and at least one of radiant energy exposure (e.g., ultraviolet, visible, or infrared), or by a thermal batch process. For example, the thermal process used to cure the insulative material may include: (1) a ramp in temperature; (2) a soaking period; and (3) a ramp down in temperature.

The dispensing means for heating and dispensing the insulative material (including the insulative particles) may be provided as a new subsystem added to an existing wirebonding device, or may be provided as a stand alone system.

Through the various embodiments of the present invention disclosed herein, the following benefits are achieved: (1) the insulative particles allow the insulative material to fill in between the bonding wires (which is particularly valuable in a semiconductor device that utilizes ultra fine pitch wirebonding); (2) a semiconductor device requiring substantially less volume of a potentially higher cost encapsulating material is provided, as opposed to a semiconductor device where the entire package is molded with the same material; and (3) a relatively low cost conventional molding compound or glob top encapsulation material (and associated equipment) may be used to overmold the package.

The application systems used to facilitate the various embodiments of the present invention may be designed to ensure that the packaging process does not suffer a reduction in productivity by the inclusion of the application of the insulative material. For example, through the use of software controls and sensor fusion, the system can integrate the functions of dispensing and curing the insulative material while concurrently performing wirebonding operations. Further, after application of the insulative material, as the packaging process continues (e.g., through resin transfer molding, glob top encapsulation, etc.), the fine bonding wires are protected from motion that have resulted in short-circuiting of adjacent bonding wires. This is at least partially due to the rapid flow of the insulative material (e.g., molding compound or encapsulant).

Figure 10:
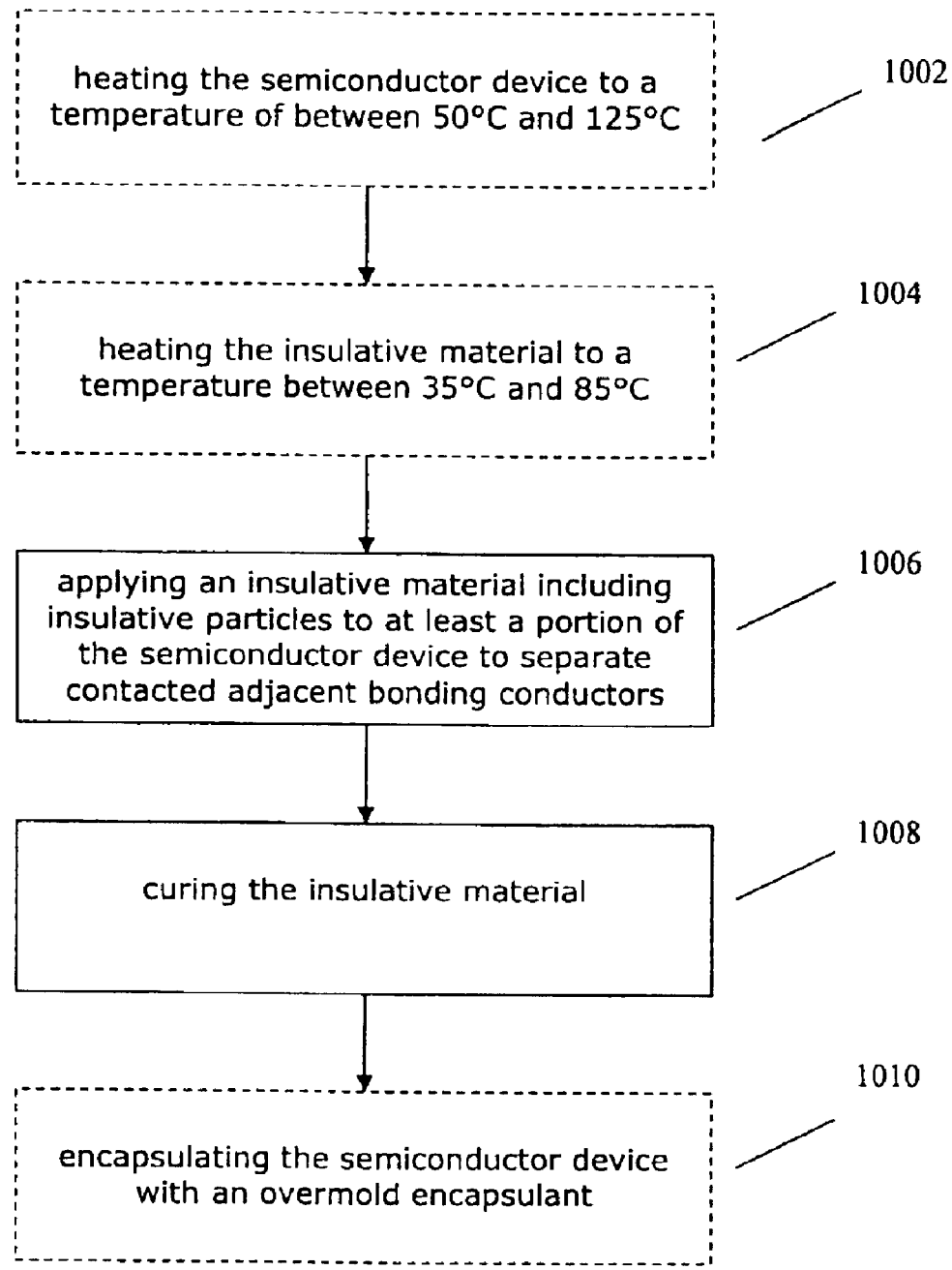
FIG. 10 is a flow diagram illustrating a method of packaging a semiconductor device in accordance with an exemplary embodiment of the present invention.

FIG. 10 is a flow diagram illustrating a method of packaging a semiconductor device according to the various aspects of the present invention described above. At optional step 1002, the subject semiconductor device is heated to a temperature between 50° C. and 125° C., and more specifically to a temperature between 80° C. and 100° C. At optional step 1004, the insulative material is heated (e.g., in the dispenser) to a temperature between 35° C. and 85° C., and more specifically to a temperature between 50° C. and 70° C. At step 1006, an insulative material (e.g., an epoxy resin) is applied to at least a portion of the semiconductor device to separate adjacent bonding conductors that are in contact with one another (i.e., short-circuited). The insulative material includes insulative particles (e.g., spherical silica particles) having a diameter smaller than a gap between adjacent conductors providing interconnection between the elements. At step 1008, the insulative material is cured. For example, the insulative material may be cured using any of the techniques disclosed herein such as by utilizing heat, radiant energy (e.g., ultraviolet radiation, visible radiation, and/or infrared radiation), and exposure to a thermal process. At optional step 1010, the semiconductor device is encapsulated with an overmold encapsulant. As such, a packaged semiconductor device is provided.

It is understood that the various embodiments of the present invention can be successfully applied to the preservation of the fine bonding wire loops during screen printing or stencil printing operations of a final layer of encapsulant onto the semiconductor device.

Although the present invention has been described primarily in relation to an insulative material being a polymer material such as an epoxy resin, it is not limited thereto. Various alternative insulative materials may be utilized so long as the material provides the desired capillary action, surface tension, insulation value, and stability to the bonding conductors.

Although the present invention has been described primarily in relation to the particles being silica particles, it is not limited thereto. Various alternative particles or beads may be utilized in the insulative material so long as the particles may disperse between adjacent conductors as desired.

Although the present invention has been described primarily in relation to curing operation utilizing heat, radiant energy, and thermal processing, it is not limited thereto. Various alternative curing operations may be utilized so long as the curing method is consistent with the particular insulative material being utilized.

It will be appreciated that other modifications can be made to the illustrated embodiments without departing from the scope of this invention, which is separately defined in the appended claims.

What is claimed:

1. A semiconductor device comprising:
   at least one semiconductor element;
   a carrier for supporting said at least one semiconductor element;
   a plurality of conductors providing interconnection between said at least one semiconductor element and said carrier; and
   an insulative material including insulative particles having a diameter smaller than a gap between adjacent ones of said plurality of conductors, said insulative material covering at least a portion of said plurality of conductors and thereby reducing the potential for short circuiting between the adjacent conductors.

2. The semiconductor device of claim 1 wherein said insulative material includes a polymer resin, and said insulative particles are silica particles.

3. The semiconductor device of claim 1 wherein said insulative material is at least partially cured by at least one of ultraviolet, visible, and infrared radiation.

4. The semiconductor device of claim 1 wherein said insulative particles occupy between 50 and 85 percent of the volume of said insulative material.

5. The semiconductor device of claim 1 wherein said insulative particles have a maximum diameter of 20 microns.

6. The semiconductor device of claim 1 wherein said insulative particles have a median diameter of approximately 4.5 microns.

7. The semiconductor device of claim 1 wherein said insulative particles have a mean diameter of approximately 4.1 microns.

8. The semiconductor device of claim 1 wherein said insulative particles provide insulated separation between at least two of said plurality of conductors.

9. The semiconductor device of claim 1 further comprising an encapsulation layer encapsulating said at least one semiconductor element, said carrier, said plurality of conductors, and said insulative material.

10. The semiconductor device of claim 9 wherein said encapsulation layer includes an overmold encapsulant.

11. The semiconductor device of claim 9 wherein said encapsulation layer includes a globtop encapsulant.

12. The semiconductor device of claim 9 wherein each of said plurality of conductors have a length at least 250 times greater than a diameter of the respective conductor.

13. The semiconductor device of claim 3 wherein a period of time between 2 and 50 seconds is provided for said insulative material to flow prior to curing said insulative material, the period of time being selected based on at least one of a size of said semiconductor device, a temperature of said semiconductor device, a temperature of said insulative material during application to said portion of said plurality of conductors, and a density of said conductors providing interconnection between said at least one semiconductor element and said carrier.

14. The semiconductor device of claim 3 wherein a period of time between 7 and 25 seconds is provided for said insulative material to flow prior to curing said insulative material, the period of time being selected based on at least one of a size of said semiconductor device, a temperature of said semiconductor device, a temperature of said insulative material during application to said portion of said plurality of conductors, and a density of said conductors providing interconnection between said at least one semiconductor element and said carrier.

15. A method of packaging a semiconductor device including at least one semiconductor element, a carrier, and a plurality of conductors providing interconnection between the at least one semiconductor element and the carrier, the method comprising the steps of:
   applying an insulative material to at least a portion of the semiconductor device and the conductors, the insulative material including insulative particles having a diameter smaller than a gap between adjacent ones of the conductors, thereby reducing the potential for short circuiting between the adjacent conductors; and
   curing the insulative material.

16. The method of claim 15 wherein said applying step includes applying the insulative material including silica particles and a polymer resin.

17. The method of claim 15 wherein said curing step includes exposing the insulative material to at least one of ultraviolet, visible, and infrared radiation.

18. The method of claim 15 wherein said curing step includes heating the insulative material and exposing the insulative material to at least one of ultraviolet, visible, and infrared radiation.

19. The method of claim 15 wherein the curing step includes applying a thermal process to the insulative material including a ramp up in temperature, a soak in temperature, and a ramp down in temperature.

20. The method of claim 15 wherein the applying step includes applying the insulative material to the device wherein the insulative particles occupy between 50 and 85 percent of the volume of the insulative material.

21. The method of claim 15 wherein said applying step includes applying the insulative material to the device wherein the insulative particles have a maximum diameter of 20 microns.

22. The method of claim 15 wherein said applying step includes applying the insulative material to the device wherein the insulative particles have a median diameter of approximately 4.5 microns.

23. The method of claim 15 wherein said applying step includes applying the insulative material to the device wherein the insulative particles have a mean diameter of approximately 4.1 microns.

24. The method of claim 15 wherein through said applying step the insulative particles disperse between adjacent ones of the conductors, thereby providing insulated separation between the ones of the conductors.

25. The method of claim 15 further comprising the step of:
   heating the semiconductor device to a temperature of between 50 and 125° C. before the applying step.

26. The method of claim 15 further comprising the step of:
   heating the semiconductor device to a temperature of between 80 and 100° C. before the applying step.

27. The method of claim 15 further comprising the step of:
   heating the insulative material to a temperature between 35 and 85° C. before the applying step.

28. The method of claim 15 further comprising the step of:
   heating the insulative material to a temperature between 50 and 70° C. before the applying step.

29. The method of claim 15 further comprising the step of:
   encapsulating the semiconductor device.

30. The method of claim 29 wherein said encapsulating step includes encapsulating the semiconductor device with an overmold encapsulant.

31. The method of claim 29 wherein said encapsulating step includes encapsulating the semiconductor device with a globtop encapsulant.

32. The method of claim 15 wherein said applying step includes applying the insulative material to the at least one semiconductor element at a substantially central portion thereof, such that the insulative material disperses from the at least one semiconductor element onto the plurality of conductors.

33. The method of claim 15 further comprising the step of:

drawing at least one of the insulative particles between adjacent ones of the conductors, thereby separating the adjacent ones of the conductors, the adjacent ones of the conductors previously being in contact with one another before said step of drawing.

34. The method of claim 15 further comprising the step of:

providing a period of time between 2 and 50 seconds for the insulative material to flow prior to said curing step, the period of time being selected based on at least one of a size of the semiconductor device, a temperature of the semiconductor device, a temperature of the insulative material during said step of applying, and a density of the conductors providing interconnection between the at least one semiconductor element and the carrier.

35. The method of claim 15 further comprising the step of:

providing a period of time between 7 and 25 seconds for the insulative material to flow prior to said curing step, the period of time being selected based on at least one of a size of the semiconductor device, a temperature of the semiconductor device, a temperature of the insulative material during said step of applying, and a density of the conductors providing interconnection between the at least one semiconductor element and the carrier.

* * * * *